United States Patent
Nozaki et al.

(10) Patent No.: US 8,546,827 B2
(45) Date of Patent: Oct. 1, 2013

(54) SEMICONDUCTOR LIGHT EMITTING DEVICE

(75) Inventors: Takahiko Nozaki, Tokyo (JP); Hiroshi Kotani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 384 days.

(21) Appl. No.: 12/960,281

(22) Filed: Dec. 3, 2010

(65) Prior Publication Data

US 2011/0133236 A1   Jun. 9, 2011

(30) Foreign Application Priority Data

Dec. 3, 2009   (JP) .................................. 2009-275555

(51) Int. Cl.
   *H01L 21/00* (2006.01)
(52) U.S. Cl.
   USPC .............................. 257/98; 257/99; 365/127
(58) Field of Classification Search
   USPC ...................................... 257/98–99; 365/127
   See application file for complete search history.

(56) References Cited

U.S. PATENT DOCUMENTS

| | | | |
|---|---|---|---|
| 6,118,685 A * | 9/2000 | Takeuchi et al. | 365/127 |
| 6,663,964 B2 * | 12/2003 | Mita et al. | 428/408 |
| 6,917,396 B2 * | 7/2005 | Hiraishi et al. | 349/64 |
| 6,949,771 B2 * | 9/2005 | Yoganandan et al. | 257/99 |
| 7,303,005 B2 * | 12/2007 | Reis et al. | 165/185 |
| 7,365,988 B2 * | 4/2008 | Reis et al. | 361/719 |
| 7,411,211 B1 * | 8/2008 | Yamazaki | 257/59 |
| 7,495,322 B2 | 2/2009 | Hashimoto et al. | |
| 7,573,717 B2 * | 8/2009 | Reis et al. | 361/719 |
| 7,777,421 B2 * | 8/2010 | Mishimagi | 315/209 R |
| 7,889,502 B1 * | 2/2011 | Reis et al. | 361/717 |
| 8,137,806 B2 * | 3/2012 | Okabayashi | 428/343 |
| 8,379,389 B2 * | 2/2013 | Kamiguchi | 361/708 |
| 2005/0253153 A1 | 11/2005 | Harada | |
| 2007/0007540 A1 | 1/2007 | Hashimoto et al. | |
| 2008/0000892 A1 * | 1/2008 | Hirano et al. | 219/433 |

(Continued)

FOREIGN PATENT DOCUMENTS

| | | |
|---|---|---|
| JP | 2005-158957 A | 6/2005 |
| JP | 2005-311170 A | 11/2005 |

(Continued)

OTHER PUBLICATIONS

Japanese Office Action for the related Japanese Patent Application No. 2009-275555 dated Jul. 23, 2013.

*Primary Examiner* — Laura Menz

(74) *Attorney, Agent, or Firm* — Kenealy Vaidya LLP

(57) ABSTRACT

A light emitting device that can radiate heat generated by a semiconductor light emitting element and/or a resin layer at not only a position directly under the light emitting element, but also a position remote from such a position with respect to the main plane direction is provided. In the light emitting device, a light emitting element is carried on a substrate, and a resin covers the light emitting element. An anisotropic heat conduction material showing a heat conductivity for the substrate main plane direction larger than that for the substrate thickness direction is carried on the substrate. A side of the anisotropic heat conduction material contacts with the resin. Thereby, the anisotropic heat conduction material can receive heat of the resin, conduct it along the main plane direction, and radiate it to the substrate at a position remote from the light emitting element and/or the resin. As the anisotropic heat conduction material, for example, one or more laminated layers of graphite in the form of sheet are used.

9 Claims, 9 Drawing Sheets

(56) References Cited

U.S. PATENT DOCUMENTS

2008/0006202 A1* 1/2008 Hirano et al. .................. 118/60
2010/0044741 A1* 2/2010 Okimura ........................ 257/99
2011/0133236 A1* 6/2011 Nozaki et al. ................... 257/98
2011/0141694 A1* 6/2011 Kamiguchi .................... 361/704
2011/0164862 A1* 7/2011 Hirano et al. .................. 392/407
2011/0262728 A1* 10/2011 Izutani et al. ................. 428/220
2011/0316038 A1* 12/2011 Hirotsuru et al. ............... 257/99

FOREIGN PATENT DOCUMENTS

| JP | 2006-86391 A | | 3/2006 |
| JP | 2007-123348 A | | 5/2007 |
| JP | 2007-208061 A | | 8/2007 |
| JP | 2008-205453 A | | 9/2008 |
| JP | 2008-287960 A | | 11/2008 |
| JP | 2009-224469 A | | 10/2009 |
| JP | 2011119459 A | * | 6/2011 |

* cited by examiner (a)

(b)

(a)

(b)

(c)

(d)

SEMICONDUCTOR LIGHT EMITTING DEVICE

This application claims the priority benefit under 35 U.S.C. §119 of Japanese Patent Application No. 2009-275555 filed on Dec. 3, 2009, which is hereby incorporated in its entirety by reference.

TECHNICAL FIELD

The present invention relates to a semiconductor light emitting device, in particular, a semiconductor light emitting device showing superior heat radiation characteristics.

BACKGROUND ART

As temperature of semiconductor light emitting elements becomes higher, luminous efficiency of the elements decreases, and higher temperature more shortens lifetime of the elements. Therefore, it is desired to increase heat radiation efficiency of semiconductor light emitting elements. For example, Patent document 1 discloses a structure that a metal body for heat radiation is adhered to a lead to be connected to a bottom surface electrode of a semiconductor light emitting element with a thin insulating adhesive layer so that heat of the semiconductor light emitting element is efficiently conducted to the metal body via the thin insulating adhesive layer.

Patent document 2 discloses an LED package carrying an LED chip so that the chip should directly contact with a metal-impregnated carbon material. The metal-impregnated carbon material is prepared by sintering hardened carbon powder or carbon fibers and impregnating the sintered body with a metal such as Cu or Al, and shows high thermal conductivity.

Patent document 3 discloses a configuration that a semiconductor light emitting element is carried on a substrate consisting of an anisotropic heat conduction layer showing larger thermal conductivity for the plane direction compared with thermal conductivity for the thickness direction, and isotropic heat conduction layers on the both surfaces of the anisotropic heat conduction layer. This aims at diffusing heat along the plane direction by using the anisotropic heat conduction layer. As the anisotropic heat conduction layer, graphite is used.

Patent document 4 discloses a configuration that an LED chip is carried on a metal heat sink, and a pattern wiring, an insulating layer, a metal core printed circuit board, and a body are disposed in this order under the heat sink. For the body, graphite showing anisotropic thermal conductivity is used to increase conduction of heat of the LED chip along the plane direction.

Patent document 5 discloses a configuration that a fluorescent substance layer for color conversion is disposed on an LED chip, wherein a metal mesh or wire rod for heat radiation is disposed inside the fluorescent substance layer. By this configuration, heat in the fluorescent substance layer is conducted with the metal mesh or the like to a base (ring) surrounding the fluorescent substance layer and thereby prevent decrease in quantity of light due to rise in temperature of the fluorescent substance.

PRIOR ART REFERENCES

Patent Documents
Patent document 1: Japanese Patent Unexamined Publication (KOKAI) No. 2007-208061

Patent document 2: Japanese Patent Unexamined Publication No. 2006-86391
Patent document 3: Japanese Patent Unexamined Publication No. 2007-123348
Patent document 4: Japanese Patent Unexamined Publication No. 2008-287960
Patent document 5: Japanese Patent Unexamined Publication No. 2005-311170

SUMMARY OF THE INVENTION

Object to be Achieved by the Invention

In a white light emitting device using a blue light emitting element and a fluorescent substance layer, the fluorescent substance for color conversion itself generates heat, and raises the temperature. Since the rise in temperature of the fluorescent substance causes thermal quenching, it poses a serious problem in high power light emitting devices. In such a configuration that a metal mesh or the like is disposed in the fluorescent substance layer as disclosed in Patent document 5, thermal capacity of the metal mesh or the like is small, and thus heat quantity that can be conducted form the metal mesh or the like to the ring is small. Moreover, since an insulated substrate on which an electric circuit is formed is disposed directly under the ring, the part of the ring for radiation of the heat conducted to the ring is limited. Furthermore, the ring is carried on the insulated substrate at a position near the light emitting element as the heat generation source and radiates heat from the carried position to the insulated substrate. However, the heat conduction of the insulated substrate is often already saturated due to heat conduction from the lower part of the light emitting element, and in such a case, sufficient heat radiation from the ring to the insulated substrate cannot be attained.

Moreover, all of the configurations disclosed in Patent documents 1 to 4 are configurations for conducting heat to a substrate or the like on the bottom surface side of the light emitting element. Therefore, if they are employed for a high power light emitting element comprising a fluorescent substance layer, it is necessary to once conduct the heat generated by the fluorescent substance to the light emitting element and then conduct it from the light emitting element to the substrate or the like. Accordingly, it is difficult to efficiently radiate the heat of the fluorescent substance layer.

Further, as a substrate for mounting a high power light emitting element, it is desirable to use a material showing a thermal expansion coefficient similar to that of the light emitting element, for example, an insulated substrate made of ceramics etc., in order to prevent degradation of bonding for mounting due to difference of the thermal expansion coefficients of the light emitting element and the substrate. If a light emitting element is mounted on a highly heat conductive metal, metal-impregnated carbon material, anisotropic heat conduction layer of graphite, or the like as disclosed in Patent documents 1 to 4, bonding for mounting may be degraded due to the difference of the thermal expansion coefficient of such a substrate from that of the light emitting element. In order to prevent such degradation, there can be supposed a configuration that an insulating substrate showing a thermal expansion coefficient similar to that of the light emitting element is disposed between the light emitting element and the highly heat conductive substrate. However, the heat conductivity of the insulating substrate may constitute a bottleneck for the heat conduction to invite saturation of the heat transfer, and thus it may become difficult to improve the heat transfer as a whole.

An aspect of the present invention is to provide a light emitting device that can radiate heat generated by a semiconductor light emitting element and/or a resin layer at not only a position directly under the light emitting element, but also a position remote from such a position with respect to the main plane direction.

Means for Achieving the Object

The present invention provides such a light emitting device as described below, that is, a light emitting device comprising a substrate, a light emitting element carried on the substrate, and a resin covering the light emitting element, wherein an anisotropic heat conduction material showing a heat conductivity for the substrate main plane direction larger than that for the substrate thickness direction is carried on the substrate, so that a side of the material should contact with the resin. To a portion of the anisotropic heat conduction material remote from the resin, a heat conductive material showing a heat conductivity larger than the heat conductivity of the anisotropic heat conduction material for the thickness direction is connected, and the heat conduction material contacts with the substrate. By this configuration, heat of the light emitting element and/or the resin can be conducted by the anisotropic heat conduction material along the main plane direction, and radiated to the substrate via the heat conductive material at a position remote from the light emitting element and the resin.

As the anisotropic heat conduction material, for example, one or more laminated layers of graphite in the form of sheet can be used.

The anisotropic heat conduction material may be configured, for example, to have an opening. In this case, the light emitting element and the resin are disposed in the opening.

There can be used a structure that the substrate comprises, for example, a metal substrate and an insulating substrate carried on a part of the metal substrate, and the light emitting element and the resin are carried on the insulating substrate. In this case, the anisotropic heat conduction material is configured so that at least one side thereof should be larger than one side of the insulating substrate, and one end thereof should be disposed on the metal substrate, and the heat conductive material is connected to the anisotropic heat conduction material carried on the metal substrate so that the heat conductive material should contact with the metal substrate. By this configuration, heat conducted by the anisotropic heat conduction material along the main plane direction can be radiated to the metal substrate.

One or more projections may be provided on a side in the aforementioned opening of the anisotropic heat conduction material. The heat conduction efficiency from the resin to the anisotropic heat conduction material can be thereby improved.

Effect of the Invention

According to the present invention, heat of the resin covering the light emitting element can be transferred along the main plane direction and radiated by using the anisotropic heat conduction material, and therefore heat can be radiated in a remote portion not influenced by thermal saturation of the portion of the substrate directly under the light emitting element etc. to improve the heat radiation efficiency. The light emitting efficiency of the light emitting element can be thereby improved. Moreover, thermal quenching of the fluorescent substance contained in the resin can be prevented, and the fluorescent light emitting efficiency can be improved. Furthermore, since the heat radiation efficiency is high, driving current for the light emitting element can be increased. By synergism of these effects, a high power light emitting device can be obtained.

MODES FOR CARRYING OUT THE INVENTION

Embodiments of the present invention will be explained.

First Embodiment

Figure 1:
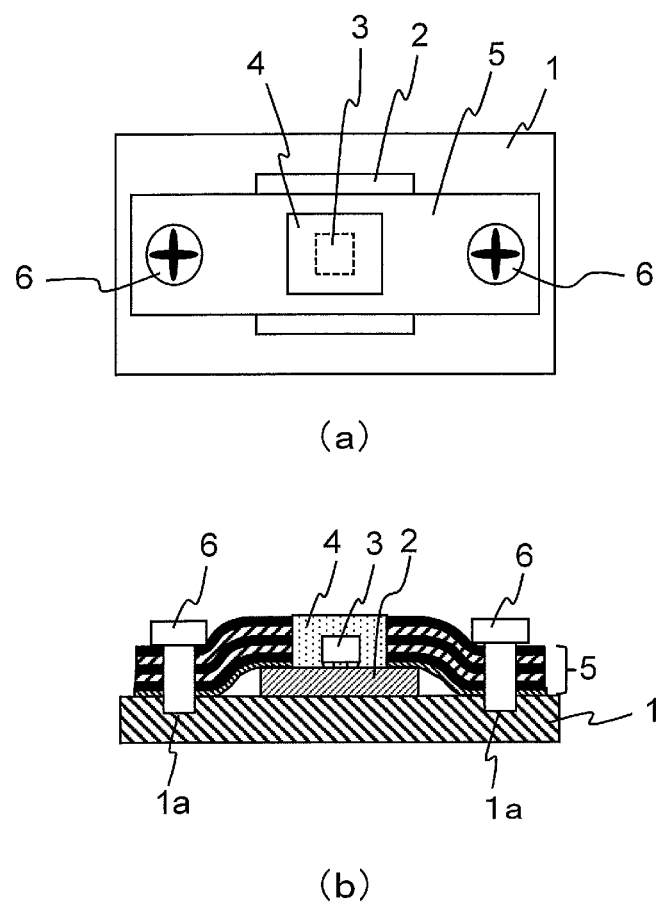
[FIG. 1] Drawings showing the light emitting device of the first embodiment: (a) top view, (b) sectional view

The semiconductor light emitting device of the first embodiment of the present invention is explained with reference to FIGS. 1, (a) and (b). As shown in FIG. 1, (a), in the semiconductor light emitting device, an insulating substrate 2 is fixed on a metal substrate 1, and a semiconductor light emitting element 3 is mounted thereon. On the surface of the insulating substrate 2, a wiring is disposed. As a method for mounting the semiconductor light emitting element 3, a known method such as gold bump is used. The upper surface and the side of the semiconductor light emitting element 3 are coated with a fluorescent substance-containing resin layer 4. The external shape of the fluorescent substance-containing resin layer 4 is a rectangular parallelepiped.

Around the fluorescent substance-containing resin layer 4, an anisotropic heat conduction material 5 in the form of a sheet is disposed to receive heat of the fluorescent substance-containing resin layer 4 and conduct it to a position remote from the fluorescent substance-containing resin layer 4. The anisotropic heat conduction material 5 has a characteristic that the heat conductivity thereof for the main plane direction is larger than the heat conductivity thereof for the thickness direction. At the center of the anisotropic heat conduction material 5, an opening of a quadrangle shape having a size comparable to that of the fluorescent substance-containing resin layer 4 is provided, and the fluorescent substance-containing resin layer 4 is disposed in the opening.

The side of the anisotropic heat conduction material 5 in the opening is desirably contacted with the side of the fluorescent substance-containing resin layer 4 without any gap, in order to improve the heat transfer efficiency from the fluorescent substance-containing resin layer 4 to the anisotropic heat conduction material 5. Thickness of the anisotropic heat conduction material 5 is preferably equivalent to the height of the fluorescent substance-containing resin layer 4, since, in such a case, area of contact with the fluorescent substance-containing resin layer 4 becomes large, therefore the heat conduction amount increases, and projection of light from the upper surface of the fluorescent substance-containing resin layer 4 is not inhibited.

Figure 2:
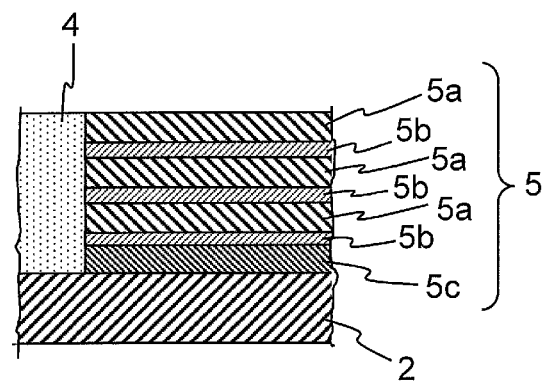
[FIG. 2] A partial enlarged sectional view of FIG. 1(b)

The anisotropic heat conduction material 5 may consist of any material, so long as it shows a heat conductivity for the main plane direction larger than the heat conductivity thereof for the thickness direction. For example, graphite made into a sheet, or alternately layered metal foils and a material showing a heat conductivity lower than that of the metal foil (for example, resin) can be used. Specifically, for example, such a material obtained by piling up a plurality of sheets of graphite 5a, adhering them with adhesive layers 5b, and further adhering an insulating layer 5c to the lowermost surface with an adhesive layer 5b as shown in FIG. 2 can be used.

The size of the anisotropic heat conduction material 5 for the main plane direction is larger than that of the insulating substrate 2 at least for the long side. Heat of the fluorescent substance-containing resin layer 4 can be thereby conducted to a position remote from the insulating substrate 2.

As shown in FIG. 1(*b*), the anisotropic heat conduction material 5 bends along the step between the upper surface of the insulating substrate 2 and the upper surface of the substrate 1, and bottom surfaces of the both end portions for the longer direction of the anisotropic heat conduction material 5 are in contact with the upper surface of the substrate 1. In these both end portions, holes penetrating the anisotropic heat conduction material 5 along the thickness direction are provided, and screws 6 penetrate them. In the substrate 1, female screws 1a are provided at the positions corresponding to the holes of the anisotropic heat conduction material 5. The tips of the screws 6 are fixed to the substrate 1 by screwing with the female screws 1a in the substrate 1.

As the screw 6, it is desirable to use a screw consisting of a material showing a heat conductivity higher than the heat conductivity of the anisotropic heat conduction material 5 for the thickness direction. For example, it desirably consists of copper or aluminum. The screw 6 receives the heat conducted by the anisotropic heat conduction material 5 along the main plane direction at the peripheral face in contact with the anisotropic heat conduction material 5, conducts it along the axial direction, and radiates it to the substrate 1.

For the insulating substrate 2, a material having a thermal expansion coefficient closer to that of the semiconductor light emitting element 3, compared with that of the metal substrate 1, and showing a heat conductivity as high as possible is used. For example, a substrate 2 made of ceramics such as aluminum nitride (AlN) is used. By mounting the semiconductor light emitting element 3 on the insulating substrate 2 having a thermal expansion coefficient close to that of the semiconductor light emitting element 3, degradation of bonding for the mounting by high temperature due to difference in the thermal expansion coefficients of the semiconductor light emitting element 3 and the mounted substrate (insulating substrate 2) can be avoided. Moreover, if the insulating substrate 2 is used, a circuit can be formed on the insulating substrate 2, and therefore it is not necessary to form a circuit via an insulating layer on the metal substrate 1, even if a plurality of light emitting elements are mounted.

Heat radiation at the time of light emission of such a semiconductor light emitting device of the first embodiment as described above will be explained.

If an electric current is applied to the semiconductor light emitting element 3, the semiconductor light emitting element 3 emits light of a predetermined wavelength, and the light enters into the fluorescent substance-containing resin layer 4. The fluorescent substance of the fluorescent substance-containing resin layer 4 absorbs a part of the light from the semiconductor light emitting element 3, and is thereby excited to emit fluorescence. The light emitted by the semiconductor light emitting element 3 and penetrating the fluorescent substance-containing resin layer 4 is mixed with the fluorescence and projected outside from the upper surface of the fluorescent substance-containing resin layer 4. For example, by using a blue light emitting semiconductor light emitting element is used as the semiconductor light emitting element 3 and a fluorescent substance emitting yellow orange fluorescence with blue excitation light such as YAG fluorescence substance as the fluorescent substance, a semiconductor light emitting device which emits white light can be provided.

Figure 3:
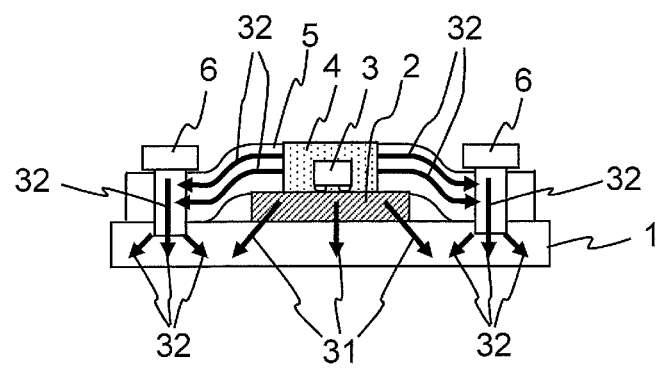
[FIG. 3] An explanatory view showing heat conduction in the light emitting device of the first embodiment
Figure 4:
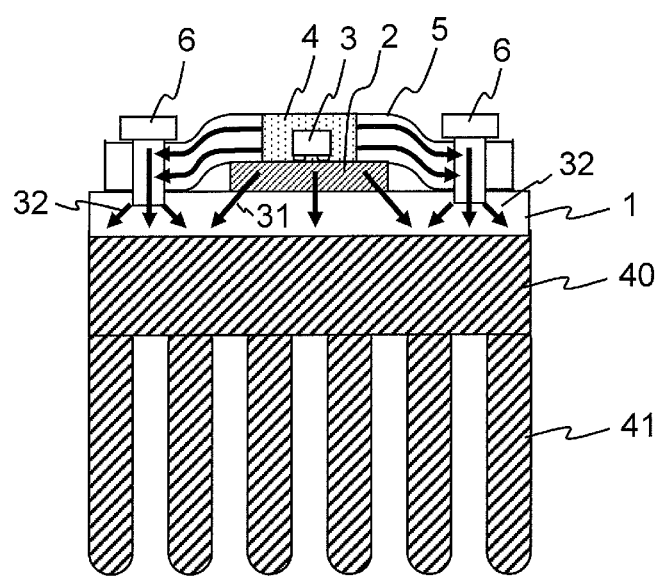
[FIG. 4] An explanatory view showing heat conduction in the light emitting device of the first embodiment attached with a heat sink

At the time of the light emission, each of the semiconductor light emitting element 3 and the fluorescent substance of the fluorescent substance-containing resin layer 4 generates heat. As shown in FIG. 3, a part of the heat 31 is conducted to the insulating substrate 2 with which the semiconductor light emitting element 3 and the fluorescent substance-containing resin layer 4 contact, diffused in the insulating substrate 2 along the main plane direction, and radiated to the metal substrate 1. With a structure that a heat sink 40 is attached to the metal substrate 1 as shown in FIG. 4, the heat conducted to the metal substrate 1 is further conducted to the heat sink 40, and radiated into the air from fins 41.

When the semiconductor light emitting element 3 emits light with high power, calorific powers of the semiconductor light emitting element 3 and the fluorescent substance-containing resin layer 4 also become large. Therefore, if the heat conductivity of the insulating substrate 2 is not sufficiently large, heat transfer is saturated in the insulating substrate 2, and heat of the semiconductor light emitting element 3 and the fluorescent substance-containing resin layer 4 may not be sufficiently radiated. Moreover, even if the heat conductivity of the insulating substrate 2 is sufficiently high, and it can transmit much heat to the metal substrate 1, heat transfer of the metal substrate 1 is saturated, and heat of the semiconductor light emitting element 3 and the fluorescent substance-containing resin layer 4 cannot be sufficiently radiated.

In the light emitting device of this embodiment, the anisotropic heat conduction material 5 is disposed so as to contact with the side of the fluorescent substance-containing resin layer 4. Therefore, the anisotropic heat conduction material 5 can directly receive a part of the heat 32 of the fluorescent substance-containing resin layer 4, conduct it along the main plane direction, and radiate it to the substrate 1 at an arbitrary position at which the metal substrate 1 is not heat-saturated (position of the screw 6).

Thereby, even if the calorific powers of the semiconductor light emitting element 3 and the fluorescent substance-containing resin layer 4 are large, and the insulating substrate 2 and the portion of the metal substrate 1 directly under the insulating substrate 2 are heat-saturated, the heat of the fluorescent substance-containing resin layer 4 can be conducted to an arbitrary position at which the metal substrate 1 leaves sufficient margins for heat radiation, and radiated, without via the insulating substrate 2, and therefore heat radiation efficiency can be improved.

Therefore, decrease in the light emission efficiency of the semiconductor light emitting element 3 due to heat can be prevented, quenching due to rise in temperature of the fluorescent substance can be prevented, and thus large quantity of light can be obtained. Moreover, since the heat radiation efficiency becomes high, a heavy current can be applied to the semiconductor light emitting element 3, and light emission can be attained with a still larger quantity of light.

Hereafter, a method for producing the light emitting device of this embodiment will be explained.

In the light emitting device of this embodiment, in order to efficiently transfer the heat of the fluorescent substance-containing resin layer 4 to the anisotropic heat conduction material 5, it is desirable that the side of the fluorescent substance-containing resin layer 4 is closely contacted with the side of the anisotropic heat conduction material 5 in the opening without forming any gap. Therefore, as a method for producing the light emitting device, at the time of forming the fluorescent substance-containing resin layer 4, a method of filling an uncured fluorescent substance-containing resin into the opening of the anisotropic heat conduction material 5, and curing it can be preferably used. Thereby, the side of the cured fluorescent substance-containing resin layer 4 can be closely contacted with the side of the anisotropic heat conduction material 5 in the opening.

The method for producing the light emitting device of this embodiment is not limited to the above method, and a method of forming the fluorescent substance-containing resin layer 4 in a predetermined shape by printing or the like, curing it, then closely contacting the anisotropic heat conduction material 5 to the side of the fluorescent substance-containing resin layer 4, and fixing the anisotropic heat conduction material 5 can also be used.

Second Embodiment

The light emitting device of the second embodiment will be explained with reference to FIG. 5.

Figure 5:
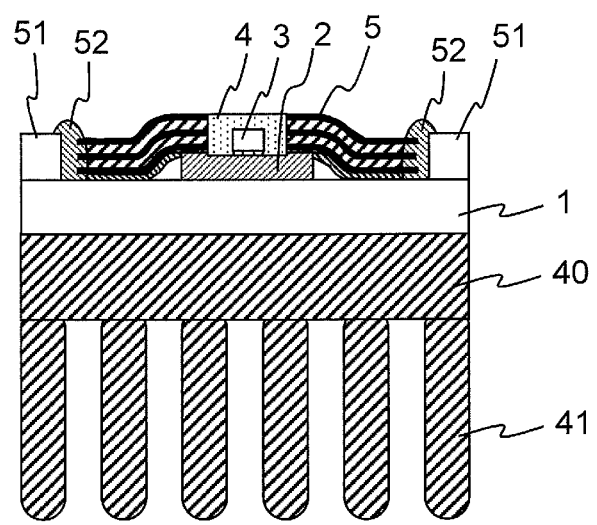
[FIG. 5] A sectional view of the light emitting device of the second embodiment

As shown in FIG. 5, the light emitting device of this embodiment has a configuration that heat of the anisotropic heat conduction material 5 is conducted to the substrate 1 without using the screw 6, unlike the first embodiment. Specifically, there is provided a projection member 51 on the substrate 1, and the side of the anisotropic heat conduction material 5 at the end thereof is fixed to the projection member 51 with a highly heat conductive adhesion member 52. For example, a cured heat conductive paste containing a highly heat conductive metal filler such as those of tungsten, carbon, copper, aluminum, silver and gold can be used as the adhesion member 52. The adhesion member 52 and the projection member 51 have, at least for the thickness direction, a heat conductivity larger than the heat conductivity of the anisotropic heat conduction material 5 for the thickness direction, and it is especially desirable that they have a heat conductivity comparable to or higher than that of the substrate 1. For example, the projection member 51 is formed with the same material as that of the substrate 1.

The heat of the fluorescent substance-containing resin layer 4 is conducted from the side of the anisotropic heat conduction material 5 to the anisotropic heat conduction material 5, and is highly efficiently conducted along the main plane direction. The conducted heat is further conducted from the side of the end of the anisotropic heat conduction material 5 to the projection member 51 via the highly heat conductive adhesion member 52, and conducted from the adhesion member 52 and the projection member 51 to the substrate 1 directly under them. Thereby, the heat of the semiconductor light emitting element 3 and the fluorescent substance-containing resin layer 4 can be radiated to the substrate 1 at a position remote from the region of the substrate 1 to which the heat is conducted via the insulating substrate 2 (directly under the insulating substrate 2), and free from fear of heat saturation.

The other configurations are the same as those of the first embodiment, and therefore explanations thereof are omitted.

In this embodiment, although the projection member 51 is carried on the substrate 1 in the above explanation, it is also possible to use a configuration that the projection member 51 is directly connected to a heat sink 40. Heat of the anisotropic heat conduction material 5 can be thereby directly radiated to the heat sink 40 without being influenced by heat saturation of the substrate 1.

Figure 6:
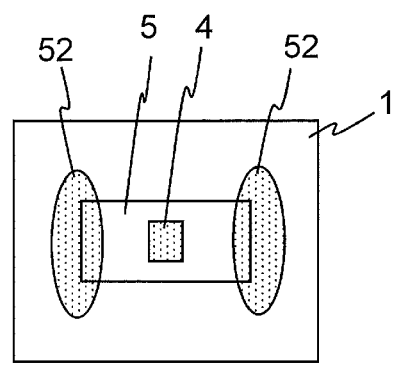
[FIG. 6] Drawings showing the light emitting device of the second embodiment wherein the anisotropic heat conduction material 5 is connected to the substrate 1 only with an adhesion member: (a) sectional view, (b) top view
Figure 6:
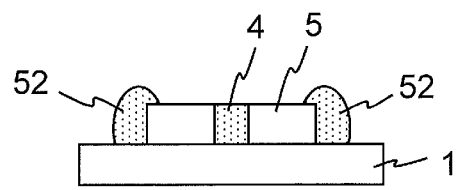
Figure 7:
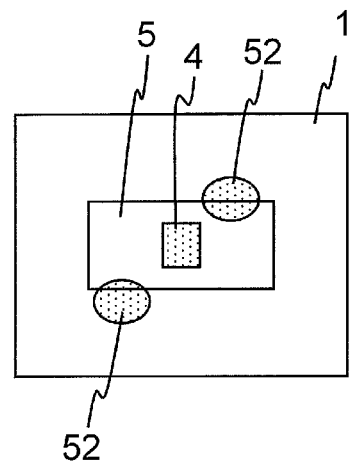
[FIG. 7] A top view of the light emitting device of the second embodiment wherein the anisotropic heat conduction material 5 is connected to the substrate 1 only with an adhesion member

Further, as shown in FIGS. 6, (*a*) and (*b*), it is also possible to connect the substrate 1 and the side of the anisotropic heat conduction material 5 only with the adhesion member 52 without using the projection member 51. In this case, it is also possible to employ a configuration that parts of the sides of the anisotropic heat conduction material 5 at the both ends for the shorter side direction are connected with the adhesion members 52, as shown in FIG. 7. The position at which the adhesion member 52 is disposed is determined at a position at which the heat is desired to be radiated to the substrate 1.

Third Embodiment

The light emitting device of the third embodiment will be explained with reference to FIG. 8.

Figure 8:
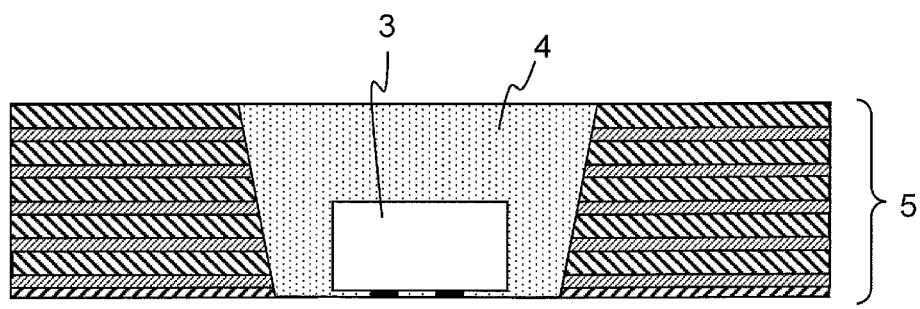
[FIG. 8] A partial sectional view of the light emitting device of the third embodiment

In the light emitting device shown in FIG. 8, the opening of the anisotropic heat conduction material 5 has a tapered side, and the opening has a larger diameter at a higher position. The fluorescent substance-containing resin layer 4 also has a shape corresponding to the shape of the opening. Thereby, the area of the side of the anisotropic heat conduction material 5 contacting with the side of the fluorescent substance-containing resin layer 4 becomes larger compared with the light emitting device of the first embodiment in which the opening has a perpendicular side, therefore heat conduction area increases, and radiation efficiency can be improved.

Although FIG. 8 shows only parts of the semiconductor light emitting element 3, the fluorescent substance-containing resin layer 4, and the anisotropic heat conduction material 5, the other configurations are the same as those of the light emitting device of the first embodiment or the second embodiment.

Fourth Embodiment

The light emitting device of the fourth embodiment will be explained with reference to FIG. 9.

Figure 9:
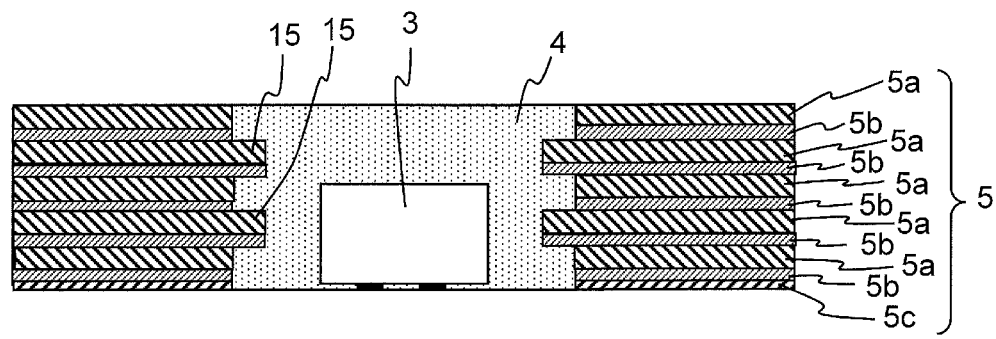
[FIG. 9] A partial sectional view of the light emitting device of the fourth embodiment

The anisotropic heat conduction material 5 of the light emitting device shown in FIG. 9 has a multi-layer structure comprising a plurality of piled up graphite sheets 5*a*, which are adhered with the adhesive layers 5*b*, and the graphite sheets 5*a* have alternately different opening diameters. There is thereby obtained a configuration that convex portions 15 are provided on the side of the opening, and the convex portions 15 are squeezed into the fluorescent substance-containing resin layer 4, as shown in FIG. 9. Therefore, the contacting area with the anisotropic heat conduction material 5 becomes large, and heat can be efficiently conducted from the fluorescent substance-containing resin layer 4 to the anisotropic heat conduction material 5.

Although only parts of the semiconductor light emitting element 3, the fluorescent substance-containing resin layer 4, and the anisotropic heat conduction material 5 are shown in FIG. 9, the other configurations are the same as those of the light emitting device of the first embodiment or the second embodiment.

Fifth Embodiment

The light emitting device of the fifth embodiment will be explained with reference to FIGS. 10 and 11.

Figure 10:
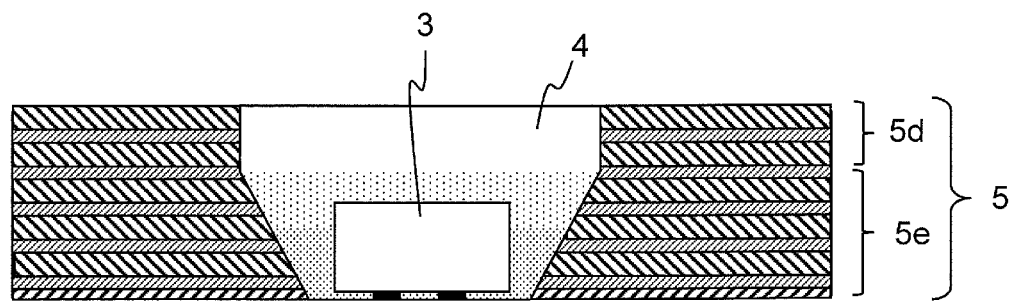
[FIG. 10] A partial sectional view of the light emitting device of the fifth embodiment
Figure 11:
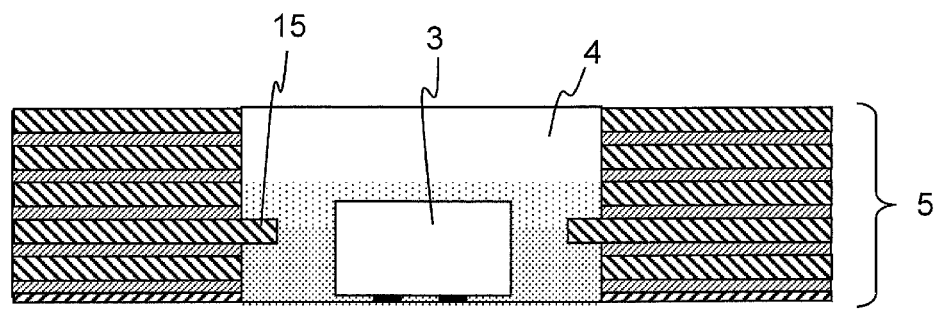
[FIG. 11] A partial sectional view of the light emitting device of the fifth embodiment

The light emitting devices of FIGS. 10 and 11 have a configuration that the fluorescent substance particles in the fluorescent substance-containing resin layer 4 are sedimented so that the fluorescent substance particles are contained at a high density in the lower part of the fluorescent substance-containing resin layer 4.

In the light emitting device of FIG. 10, the anisotropic heat conduction material 5 is divided into a lower layer 5e and an upper layer 5d, the lower layer 5e has a tapered side of the opening, and the upper layer 5d has a perpendicular side of the opening, so that the heat of the sedimented fluorescent substance particles can be efficiently conducted to the anisotropic heat conduction material 5.

On the other hand, in the light emitting device shown in FIG. 11, a convex portion 15 is formed on the lower part of the side of the opening of the anisotropic heat conduction material 5, as in the case of the fourth embodiment.

By using such a configuration that the heat of the fluorescent substance-containing resin layer 4 can be efficiently received with the lower part of the side of the opening of the anisotropic heat conduction material 5 as described above, the heat radiation efficiency of the fluorescent substance-containing resin layer 4 in which the fluorescent substance particles are sedimented can be effectively improved.

Although FIGS. 10 and 11 shows only parts of the semiconductor light emitting element 3, the fluorescent substance-containing resin layer 4, and the anisotropic heat conduction material 5, the other configurations are the same as those of the light emitting device of the first embodiment or the second embodiment.

Sixth Embodiment

The light emitting device of the sixth embodiment will be explained with reference to FIG. 12.

Figure 12:
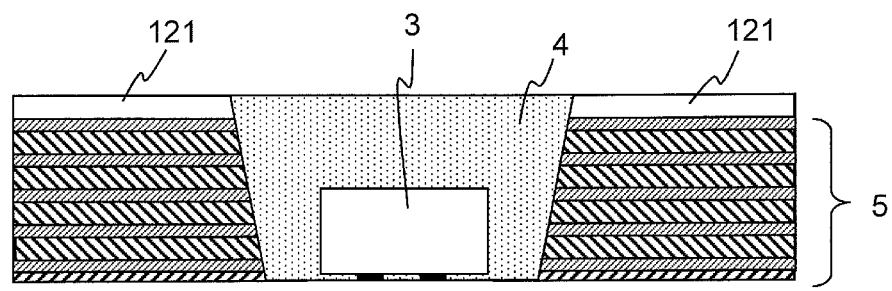
[FIG. 12] A partial sectional view of the light emitting device of the sixth embodiment

The light emitting device shown in FIG. 12 has a light-reflecting layer 121 on the upper surface of the anisotropic heat conduction material 5. As the light-reflecting layer 121, a white sheet prepared by adding white powder such as those of ceramics and titanium oxide into a resin material, and making the mixture into a sheet can be used. This white sheet is adhered on the anisotropic heat conduction material 5 with an adhesive layer or the like. Further, it is also possible to apply a resin material to which white powder is added on the anisotropic heat conduction material 5 to form a coated film, and thereby form the light-reflecting layer 121.

By providing the light-reflecting layer 121 as described above, light emitted by the semiconductor light emitting element 3 can be reflected by the light-reflecting layer 121, and therefore even when the light reflectance of the anisotropic heat conduction material 5 is low, decrease of quantity of light due to absorption by the anisotropic heat conduction material 5 can be suppressed.

Although FIG. 12 shows only parts of the semiconductor light emitting element 3, the fluorescent substance-containing resin layer 4, and the anisotropic heat conduction material 5, the other configurations are the same as those of the light emitting device of the first embodiment or the second embodiment.

Seventh Embodiment

Figure 13:
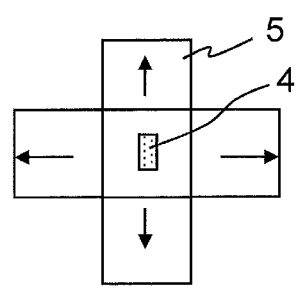
[FIG. 13] Explanatory views showing various upper surface shapes of the anisotropic heat conduction material 5 of the light emitting device of the seventh embodiment and heat conduction in them ((a) to (d))
Figure 13:
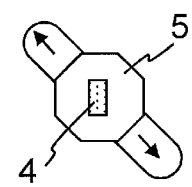
Figure 13:
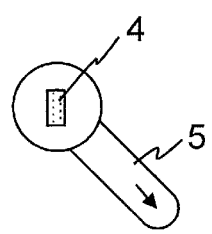
Figure 13:
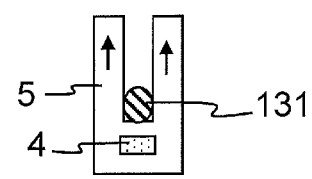

Although the anisotropic heat conduction materials 5 having a rectangular upper surface are used in the first to sixth embodiments, the shape of the anisotropic heat conduction material 5 can be designed to have an arbitrary shape such as shown in FIGS. 13, (*a*) to (*d*), according to the position of the fluorescent substance-containing resin layer 4 as the heat source and the position at which heat radiation is desired.

For example, by using such a shape that rectangular anisotropic heat conduction materials 5 are perpendicularly intersected as shown in FIG. 13, (*a*), the heat of the fluorescent substance-containing resin layer 4 can be conducted along the four kinds of the main plane directions, and radiated from the sides of the ends to the substrate 1.

By using the anisotropic heat conduction material 5 having such a shape that strips are connected to two sides of a hexagon as shown in FIG. 13, (*b*), the heat of the fluorescent substance-containing resin layer 4 can be conducted along the diagonal directions of the fluorescent substance-containing resin layer 4, and radiated.

By using the anisotropic heat conduction materials 5 having such a shape that a strip is connected to a circle as shown in FIG. 13, (*c*), the heat of the fluorescent substance-containing resin layer 4 can be conducted along one direction, and radiated.

By using the anisotropic heat conduction materials 5 having such a bifurcated shape as shown in FIG. 13, (*d*), the heat of the fluorescent substance-containing resin layer 4 can be conducted along one direction avoiding an obstacle 131 on the substrate 1, and radiated at a position remoter from the fluorescent substance-containing resin layer 4 compared with the obstacle 131.

Although the embodiments described above utilize a configuration that the insulating substrate 2 is disposed on the metal substrate 1, it is also possible to employ a configuration that an insulating layer and a wiring layer are disposed on the metal substrate 1, and the semiconductor light emitting element 3 is mounted thereon. Also in this case, the heat of the semiconductor light emitting element 3 and the fluorescent substance-containing resin layer 4 can be radiated from not only a portion of the substrate directly under the light emitting element 3, but also a portion of the substrate remote from the portion directly under the light emitting element 3 by disposing the anisotropic heat conduction material 5, and therefore heat can be efficiently radiated to the substrate 1 at two or more positions.

Although the embodiments described above utilize a configuration that the anisotropic heat conduction material receives heat from the side of the fluorescent substance-containing resin layer, the present invention is not limited to this configuration, and it is also possible to use a configuration of the light emitting device that the side of the anisotropic heat conduction material is closely contacted with other members such as a sealing resin of the semiconductor light emitting element and a reflection ring, which do not contain any fluorescent substance, to conduct the heat and radiate it at a desired position.

The light emitting device of the present invention is suitable for lighting apparatuses using a semiconductor light emitting element, on-vehicle head lamps, and so forth, in particular, light emitting devices for which output of a large amount of light is desired.

EXAMPLE

Example

As an example, the light emitting device shown in FIGS. 1, (a) and (b) was manufactured.

As the metal substrate 1, a 25 mm-square copper substrate was prepared. In the metal substrate 1, female screws 1a were formed at positions corresponding to the positions of through-holes 143 of the anisotropic heat conduction material 5 to be formed afterward.

As the insulating substrate 2, a 5 mm-square aluminum nitride substrate on which a circuit pattern was formed beforehand was prepared, and fixed on the metal substrate 1. On the insulating substrate 2, a 1 mm-square semiconductor blue light emitting element 3 was mounted by using a gold bump.

Three layers each of graphite sheets 5a (20 mm×4 mm, thickness: 40 μm, trade name: Graphite Sheet, KANEKA Corporation) and adhesive layers 5b made of an acrylic adhesive having a thickness of 10 μm were alternately laminated and adhered. A polyimide sheet having a thickness of 50 μm was adhered as an insulating layer 5c to the lowermost layer. On the lower surface of the insulating layer 5c, an adhesive layer having a thickness of 10 μm was further formed. Heat conductivity of one sheet of the graphite sheet 5a was 4 to 6 w/mk for the thickness direction, or 1200 w/mk for the plane direction.

Figure 14:
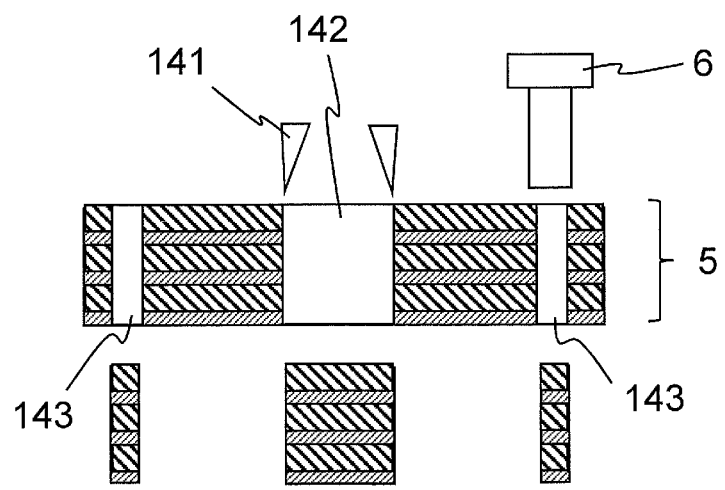
[FIG. 14] An explanatory view showing the processing of the anisotropic heat conduction material in the method for producing the light emitting device of the example

At the center of the laminate of the graphite sheets 5a, a 1.1 mm-square opening was formed by using a cutting tool 141 as shown in FIG. 14. Further, at the both end portions for the long side direction, through-holes 143 for inserting screws 6 were formed by using a punch, die cutter, or the like. The diameter of the through-hole 143 was made smaller than the screw diameter of the screw 6, so that the side of the screw 6 can be easily closely contacted with the graphite sheet.

The anisotropic heat conduction material 5, which was a laminate of the graphite sheets 5a in which the opening 142 and through-holes 143 were formed, was manufactured as described above.

Then, the anisotropic heat conduction material 5 was placed over the insulating substrate 2 with such positioning that the semiconductor light emitting element 3 on the insulating substrate 2 should be inserted into the opening 142 in a non-contacting state, and adhered to the insulating substrate 2 by adhesion of the bottom surface of the insulating layer 5c. Furthermore, the female screws of the substrate 1 and the through-holes 143 were aligned, and then end portions of the anisotropic heat conduction material 5 were adhered to the substrate 1.

A YAG fluorescent substance was dispersed in a silicone resin, and filled into the opening 142 of the anisotropic heat conduction material 5, in which the semiconductor light emitting element 3 is inserted, by printing or the like. Then, the silicone resin was cured by heating at 150° C. for 4 hours. The fluorescent substance-containing resin layer 4, of which side closely contacts with the graphite sheets 5a, was thereby formed.

Finally, the screws 6 were inserted into the through-holes 143, and screwed with the female screws 1a of the substrate 1. The light emitting device shown in FIGS. 1, (a) and (b) was manufactured as described above.

Figure 15:
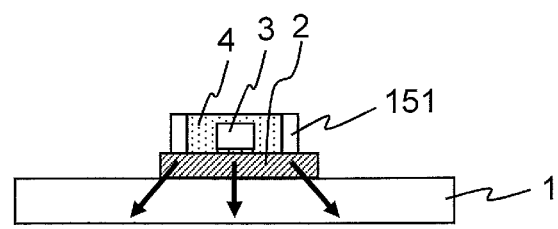
[FIG. 15] An explanatory view showing heat conduction in the light emitting device of the comparative example

As a comparative example, the light emitting device shown in FIG. 15 was manufactured. This light emitting device had the same configurations of the substrate 1, the insulating substrate 2, and the semiconductor light emitting element 3 as those of the example mentioned above, but it was formed by mounting a ring 151 on the insulating substrate 2 instead of the anisotropic heat conduction material 5, and filling the fluorescent substance-containing resin 4 in the ring 151.

When the light emitting device of the example and the light emitting device of the comparative example were turned on, the light emitting device of the comparative example radiated heat to the substrate 1 via the insulating substrate 2 under the semiconductor light emitting element 3 and the fluorescent substance-containing resin layer 4, but even though the heat conductivity of the substrate 1 was as large as 398 w/mk, the heat conductivity of the insulating substrate 2 was about 170 w/mk, therefore the insulating substrate 2 constituted a bottleneck, and thus sufficient heat radiation could not be attained.

Not only the light emitting device of the example attained heat radiation to the substrate 1 via the insulating substrate 2 under the semiconductor light emitting element 3 and the fluorescent substance-containing resin layer 4, but also it could conduct the heat along the main plane direction and radiate it to the substrate 1 at the positions of the screws 6, since the heat conductivity of the anisotropic heat conduction material 5 for the main plane direction was as large as 1200 w/mk. Therefore, heat radiation to the portions of the substrate 1 directly under the screws 6 could be attained without being influenced by heat saturation of the portion of the insulating substrate 2 and the substrate 1 directly under the semiconductor light emitting element 3. Thereby, rise in temperature of the semiconductor light emitting element 3 and the fluorescent substance could be prevented, luminous efficiency could be raised, and thermal quenching of the fluorescent substance could be prevented. Therefore, a further heavier current could be applied, and a large output could be obtained.

What is claimed is:

1. A semiconductor light emitting device comprising a substrate, a semiconductor light emitting element carried on the substrate, and a resin covering the semiconductor light emitting element, wherein:
   an anisotropic heat conduction material showing a heat conductivity for the substrate main plane direction larger than that for the substrate thickness direction is carried on the substrate, so that a side of the anisotropic heat conduction material contacts with the resin covering the semiconductor light emitting element,
   to a portion of the anisotropic heat conduction material remote from the resin, a heat conductive material showing a heat conductivity larger than the heat conductivity of the anisotropic heat conduction material for the thickness direction is connected, and the heat conduction material contacts with the substrate,
   wherein the anisotropic heat conduction material consists of one or more laminated layers of graphite in the form of sheet.

2. The semiconductor light emitting device according to claim 1, wherein the anisotropic heat conduction material has an opening, and the semiconductor light emitting element and the resin are disposed in the opening.

3. The semiconductor light emitting device according to claim 1, wherein the substrate comprises a metal substrate and an insulating substrate carried on a part of the metal substrate, the semiconductor light emitting element and the resin are carried on the insulating substrate, at least one side of the anisotropic heat conduction material is larger than one side of the insulating substrate, one end of the anisotropic heat conduction material is disposed on the metal substrate, the heat conductive material is connected to the anisotropic heat conduction material carried on the metal substrate, and the heat conductive material contacts with the metal substrate.

4. The semiconductor light emitting device according to claim 3, wherein one or more projections are provided on a side of the anisotropic heat conduction material in the opening.

5. The semiconductor light emitting device according to claim 1, wherein the anisotropic heat conduction material has a penetrating hole, and the heat conductive material is a screw inserted in the penetrating hole.

6. The semiconductor light emitting device according to claim 1, wherein the heat conductive material is an adhesive material containing a metal filler, and connected to an end of the anisotropic heat conduction material.

7. The semiconductor light emitting device according to claim 5, wherein a fluorescent substance is dispersed in the resin, the fluorescent substance being sedimented to the lower portion of resin, and the projection on the side of the opening of the anisotropic heat conduction material is provided at a portion containing the sedimented fluorescent substance of the resin.

8. The semiconductor light emitting device according to claim 1, wherein a light reflector is provided on the surface of the anisotropic heat conduction material.

9. The method which produces the semiconductor light emitting device of claim 1.

* * * * *